United States Patent [19]

Marchisi

[11] Patent Number: 5,034,350
[45] Date of Patent: Jul. 23, 1991

[54] SEMICONDUCTOR DEVICE PACKAGE WITH DIES MOUNTED ON BOTH SIDES OF THE CENTRAL PAD OF A METAL FRAME

[75] Inventor: Giuseppe Marchisi, Milan, Italy

[73] Assignee: SGS Thomson Microelectroni-s S.r.l., Brianza, Italy

[21] Appl. No.: 493,466

[22] Filed: Mar. 14, 1990

Related U.S. Application Data

[62] Division of Ser. No. 245,747, Sep. 16, 1988, abandoned.

[30] Foreign Application Priority Data

Sep. 23, 1987 [IT] Italy ................................ 83658/87

[51] Int. Cl.⁵ ........................................... H01L 21/60
[52] U.S. Cl. ................................. 437/207; 437/216; 437/217; 437/220; 29/827; 264/272.17
[58] Field of Search ............... 437/206, 216, 217, 220, 437/207; 29/827; 264/272.17

[56] References Cited

U.S. PATENT DOCUMENTS

| | | | |
|---|---|---|---|
| 3,597,666 | 8/1971 | Taskovich et al. | 437/206 |
| 4,451,973 | 6/1984 | Tateno et al. | 437/220 |
| 4,529,667 | 7/1985 | Shiga et al. | 428/646 |
| 4,637,130 | 1/1987 | Fujii et al. | 437/206 |

FOREIGN PATENT DOCUMENTS

| | | | |
|---|---|---|---|
| 54-144872 | 11/1979 | Japan . | |
| 55-22889 | 2/1980 | Japan . | |
| 56-62351 | 5/1981 | Japan . | |
| 57-40945 | 3/1982 | Japan . | |
| 62-219531 | 9/1987 | Japan | 437/216 |
| 62-287656 | 12/1987 | Japan | 437/217 |

Primary Examiner—Olik Chaudhuri
Assistant Examiner—Andrew Griffis
Attorney, Agent, or Firm—Bierman and Muserlian

[57] ABSTRACT

A semiconductor device in a plastic or ceramic package contains at least one silicon die on each side of a central die pad of a single metal frame, thus allowing a substantial space saving on the printed circuit assembly card.

The bonding of the silicon dies and the soldering of the connecting wires are performed on both sides of the frame by employing a special slotted clamp fixture inside which a strip of frames is clamped during these assembly operations and relative quality control operations.

3 Claims, 1 Drawing Sheet

5,034,350

SEMICONDUCTOR DEVICE PACKAGE WITH DIES MOUNTED ON BOTH SIDES OF THE CENTRAL PAD OF A METAL FRAME

This is a division of U.S. application Ser. No. 245,747 filed Sept. 16, 1988, now abandoned.

BACKGROUND OF THE INVENTION

1. Field of the invention

The invention relates, in general, to semiconductor devices and to the fabrication techniques thereof. More particularly it relates to a semiconductor device in a plastic or ceramic package containing more than one silicon chip or die.

2. Description of the orior art

In the art of fabricating semiconductor devices, beside the development of integration techniques and of relative fabrication processes of the silicon die, new packages, adapted to particular requirements of different types of devices designed for different applications, are also being developed.

The package, that is the encapsulating body housing the semiconductor die and protecting it from the atmosphere as well as providing means for assembly and connection on a system's card, must possess requisites which vary with the varying of the scale of integration (more or less pins being required), with miniaturization requirements, and/or with the necessity of providing an adequate heat dissipation capability.

The striving to increase the number of functions performed in the smallest space as possible, besides promoting an ever increasing scale of integration of the monolithically integrated circuits, often imposes delicate compromises in the choice of the particular fabrication technology of the integrated circuits because of poor compatibility among different fabrication techniques. For these reasons, in making complex systems, it is necessary to employ distinct integrated devices for performing certain functions. This implies an increased area requirement on printed circuit cards and an increased number of solderings of external pins of different devices assembled on the printed circuit card.

Lately, where the availability of a sufficient number of external terminals allows it, a technique of mounting two or more silicon dies in a single plastic or ceramic package has been implemented. This technique allows a simea on the printed circuit card but requires the use of a package having a die pad with increased dimensions sufficient to accomodate several silicon dies mounted side by side thereon. This greatly reduce the effective space saving on the printed circuit card.

SUMMARY OF THE INVENTION

A main objective of the present invention is to provide an improved technique for mounting a plurality of silicon dies in a single plastic or ceramic package which allows an increased saving of space in respect to the techniques of the prior art.

This and other objectives and advantages are achieved by the devices and the method for making them, objects of the instant invention, as defined in the annexed claims.

The "multichips" device (i.e. incorporating two or more distinct silicon chips or dies) of the invention has silicon dies mounted on both sides of a single metal frame having a number of leads sufficient for the external connections of the distinct dies (integrated circuits) mounted inside the unique package. The method of fabricating these devices according to the present invention contemplates the silvering or gold plating of the metal frame over both sides thereof and the bonding of the dies on both sides of a frame's central die pad as well as the soldering of the wires connecting the inner extremities of the different leads of the frame to the respective metallized contact pads on the front of the dies bonded on both sides of the frame's central die pad.

DESCRIPTION OF THE PREFERRED EMBODIMENT

Figure 1:
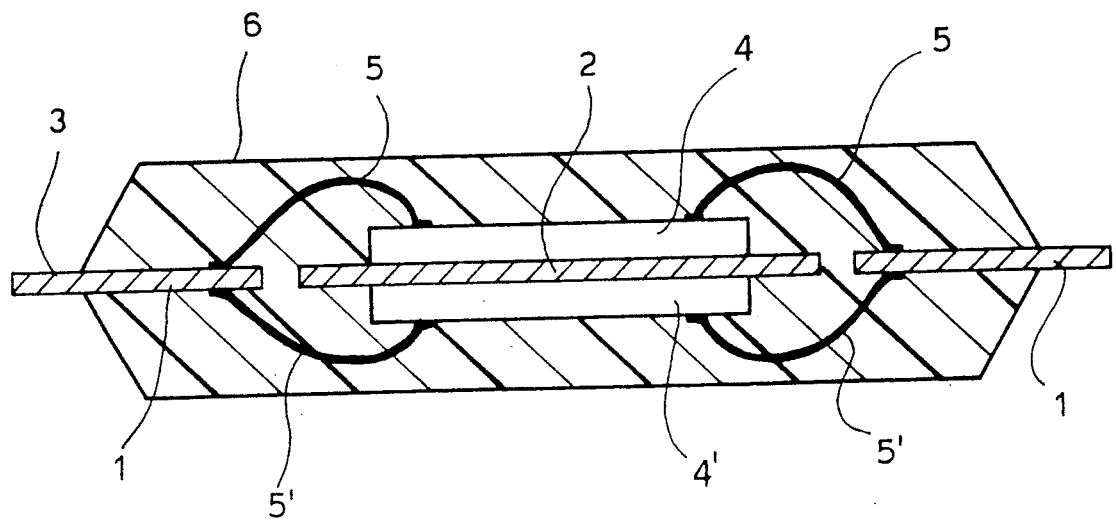
FIG. 1 is a schematic cross-sectional view of a device of the invention having a plastic type package.

A device made in accordance with the invention is shown in FIG. 1. It comprises a single metal frame 1 having a central die pad 2 essentially coplanar with the leads 3 of the frame. The frame may be of a substantially standard type, such as the "dual" type or the "quod" type, of copper or of a copper alloy, preferably nickel coated.

Both faces of the central die pad 2 and of the inner extremities of the leads 3 of the metal frame are silver coated by means of galvanic deposition in order to favor the bonding of the silicon dies and the soldering the connecting wires, according to common practices.

At least one silicon die 4 and 4' is bonded onto each of the two sides of the central die pad 2 of the frame by means of a metal powder loaded epoxy resin adhesive (or with a mixture of glass powder and metal powder in the case of ceramic packages), typically silver powder is used.

Gold or aluminum connecting wires 5 and 5' are soldered, respectively, to different contact pads of the silicon dies and to as many different leads (fingers) 3 of the metal frame 1.

The "multichips" device of the invention is then encapsulated in a body 6 of resin (plastic type package), or it is closed between two ceramic (alumina) shells in the case of a ceramic type package, from which t h e external pins (the other extremities of the leads or fingers of the metal frame) for the external connection of the device, e.g. on a printed circuit card, emerge.

The extreme compactness achieved by the multichips device made in accordance with the present invention is evident. Differently from the multichip devices of the prior art, i.e. with the silicon dies all mounted on one side only of the central die pad of the frame, which is customarily depressed with respect to the plane of the frame's leads according to common assembly techniques, the device made in accordance with the present invention effectively achieves a decisive space saving.

Common techniques for assembling silicon dies into the relative packages contemplate, genera lly, punching of the frames on a continuous band of copper or of copper alloy eventually accompanied by a depression of the frames' central die pad which remains solidly connected to the rest of the frame through at least two leads (fingers) used as a support and electrical connection means of the die pad, followed by the silver or gold plating of the top surface of the depressed central die pad and of the inner extremities of the fingers on one side only thereof (the punched frames being still in the form of a continuous punched metal band at this point of processing).

According to the method of the present invention, during the punching of the frames in a continuous metal band, the central die pad thereof is not depressed with respect to the plane of the fingers but is maintained coplanar thereto.

The central die pad and the extremities of the fingers adjacent thereto of the different frames formed by punching along a continuous thin metal band of copper or of a suitable alloy thereof (eventually a nichel plated) are then silver or gold plated by galvanic deposition on both sides thereof.

This operation may be carried out utilizing the same fixtures used for galvanic deposition over one side only of the punched metal band by passing the continuous band of punched frames through the apparatus, first on one side and subsequently on the reverse side, in order to silver or gold plate both sides of the central or inner area of each frame. Alternatively, an existing galvanic deposition apparatus may be easily modified so that, with a single passage, it is possible to galvanically deposit silver or gold over both faces of the punched metal band passed therethrough.

At this point, the continuous band is preferably cut into a series of strips, each having a length of about 20 centimeters and containing a finite number of punched frames (typically about a dozen). These equal length strips, perfectly straightened, are loaded into magazines for automatic handling by means of suitable "pick-ups" according to known and widely utilized automation techniques.

According to the method of the invention the sequence of operations which follow, until the completion of the soldering of the connecting wires, are conducted on each strip of punched frames picked-up from one of said magazines while the metal strip is being held in a clamp type fixture composed of two jaws, each having slots or openings coinciding with the inner central area of each one of the frames punched along the length of the strip (the central area comprising the die pad and the adjacent extremities of the leads). The two jaws may be hinged together along one side and they can be blocked one over the other in a perfect alignment therebetween and in respect to the strip of frames, ensured by means of suitable holes and co-operating centering pins, respectively on one side and on the other side of the strip of frames held as in a sandwich. Both jaws or superimposing parts of said clamp are essentially rigid and rigidly keep flat the lamina through which have been punched a number of frames.

Figure 2:
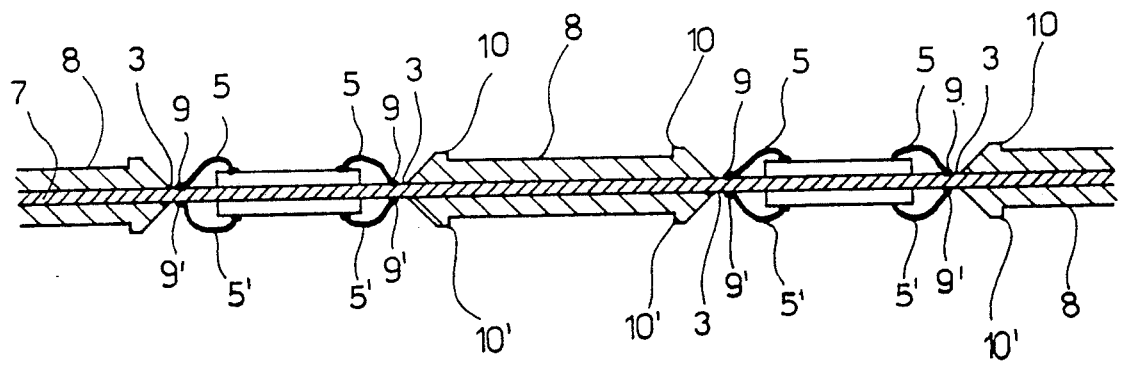
FIG. 2 is a schematic partial cross-sectional view of the tooling contemplated by the method of the invention for fabricating devices with dies bonded on both sides of the frame.

A schematic view of such a clamp is shown, though partially, in FIG. 2.

As it is observed in the partial section shown in FIG. 2, a strip 7 of frames, formed by punching through a metal band, is held in a clamp 8 formed by two jaws, i.e. two superimposable parts, substantially similar, of stainless steel or other material having a good thermal conductivity and a substantial rigidity, which are capable of being fastened together with the frames' strip 7 therebetween in order to ensure to the assembly a sufficient rigidity.

The upper jaw or part as well as the lower jaw or part of the clamp fixture, has slots or openings which coincide with respective central areas of each frame present along the strip of frames 7. The profile of these openings is preferably tapered as shown in FIG. 2 in order to have the perimeter of the opening as close as possible to the soldering points 9 and 9' of the connecting wires 5 and 5' to the extremities of the respective leads 3 of the frames, while leaving as much manouvering space as possible to the soldering heads. Moreover, the inclined wall of the openings or slots in each jaws of the clamp 8 extend preferably to the ridge of a seam or raised portion 10 and 10' formed around the whole perimeter of each opening, as shown in FIG. 2. This perimetral ridge 10 or 10' raises from the normal level of the jaw body 8 by a height sufficient to protect the connecting wires 5 and 5' during the soldering thereof to the respective contact pads of the silicon dies and to the respective extremities of the leads of the relative frame. The whole assembly formed by the strip 7 of frames closed between the two jaws of the clamp 8 rests on said raised perimetral ridges 10 or 10' which are perfectly coplanar among themselves.

The peculiar shape of the openings through the two jaws composing said clamp 8 is moreover instrumental to impart sufficient rigidity to the free extremities of the leads 3 of each frame which protrude by a short distance (cantilever) from the profile of the openings of the clamp. The rigidity is sufficient to permit ultrasonic soldering or the so-called thermal-sonic soldering of the extremities of the connecting wires on the protruding ends of the frames' leads. In case the soldering of the wires, both to the extremities of the leads of the frame and to the respective contact pads on the silicon dies, is effected with techniques which require heating of the surface on which soldering is to be effected (to about 200°-230° C.), e.g. according to thermalsonic or thermal-pressure techniques, the clamp 8 constitutes a primary means for transferring heat from a source to the leads' extremities and, by conduction through the connecting leads, also to the central die pad 2 and from the latter, through the thickness of the silicon die, to the contact pads on the surface or front of the silicon die. Therefore the material making up the clamp 8 is preferably a material having a high heat conductivity.

The application of a dosed amount of a conductive adhesive (epoxy resin loaded with silver powder), on both sides of the central die pad of each of the frames of the strip held in the clamp 8, and the subsequent bonding of the silicon dies and curing heat treatment of the adhesive may be carried out in a manner substantially similar to the way these operations are carried out on a frames' strip, according to common practice, i.e. on a side only of the strip. Carrying out these operations on both sides of the frames held in the clamp 8 may conveniently be carried out in a purposely fitted machine having adhesive distributing pads and automatic pickups of the silicon dies, counteracting from both sides of the clamp fixture 8 of the strip of frames being processed.

Also the subsequent soldering operation of the connecting wires, commonly gold wires, to the respective contact pads on the front of the silicon dies bonded on both sides of each frame and to the respective extremities of the frame leads, are performed with the frames' strip being held in the clamp 8. The latter provides the necessary rigidity and protection of the connecting wires during the soldering operations and standard visual quality control operations.

Once the soldering of the connecting wires is completed, the strip of frames 7 may be extracted out of the clamp 8 and, except for the necessary precautions to be taken in handling in order to preserve the integrity of the soldered connecting wires which are present on both sides of the strip, the fabrication process may proceed with the resin encapsulation of the silicon dies, of the connecting wires and of the extremities of the leads of the frames according to common practice, by forming a resin body which constitutes the plastic container of the device. This operation is commonly conducted by placing the strip of frames in a mold into which resin under pressure is injected according to the so-called transfer molding technique, at a temperature of about 150° C.–180° C. and at a pressure of several atmospheres for few seconds. Subsequently the plastic material may be heat treated in order to complete reticulation thereof for several hours at a temperature higher than 100° C.

In case of ceramic type packages, the encapsulation of the devices is carried out by using suitable pre-molded and sintered semi-shells of alumina or similar material. Glass is previously deposited over the matching edges of the two semi-shells and, during a heat treatment in oven (400° C.–550° C.), solders together the two ceramic semi-shells and seals the protruding metal leads of the frame, the extremities of which, after being pierced from interconnecting portions of the metal frame which are discarded and bending, constitute the pins of the finished device.

What is claimed is:

1. A method for fabricating semiconductor devices in a package containing a plurality of silicon dies comprising
   (a) forming a strip containing a finite number of frames defined by punching through a metal band, each frame comprising a central die pad and a plurality of coplanar leads at least partially coated with a layer of galvanically deposited metal belonging to the group comprising silver and gold over both sides of said strip;
   (b) clamping said strip of frames between two jaws of an essentially rigid clamp made of a heat conducting material, each jaw being provided with an opening coinciding with said central die pad and adjacent extremities of said leads of each of said frames of the strip;
   (c) bonding at least a silicon die on each side of said central die pad, soldering connecting wires to contact pads on the front of said dies and to the extremities of respective leads, operating through said openings in the two jaws on both sides of each of said frames while keeping said strip of frames clamped between said two jaws of said clamp.

2. The method of claim 1, wherein after bonding a silicon die on each side of a central die pad, the dies bonded on both sides of the relative central die pad, the soldered connecting wires, the inner portion of the relative leads are hermetically encapsulated in an epoxy resin constituting, after separation of the relative metal frame from the other frames of the strip, a semiconductor device containing two distinct silicon dies mounted, respectively, on opposite sides of a single metal frame.

3. The method of claim 1, wherein after bonding a silicon die on each side of a central die pad, the dies bonded on both sides of the relative central die pad, the soldered connecting wires, the inner portion of the relative leads are hermetically encapsulated in a hollow ceramic shell constituting, after separation of the relative metal frame from the other frames of the strip, a semiconductor device containing two distinct silicon dies mounted, respectively, on opposite sides of a single metal frame.

* * * * *